United States Patent [19]

Kuzmik et al.

[11] Patent Number: 5,332,465
[45] Date of Patent: Jul. 26, 1994

[54] PROCESS FOR PREPARING PLASTIC SURFACES TO BE PLATED

[75] Inventors: John J. Kuzmik, Torrington; Massimo DiMarco, Watertown, both of Conn.; Howard L. Morris, New Palestine, Ind.; Dennis R. Boehm, Fort Thomas, Ky.

[73] Assignee: MacDermid, Incorporated, Waterbury, Conn.

[21] Appl. No.: 117,993

[22] Filed: Sep. 8, 1993

[51] Int. Cl.$^5$ .............................................. B05D 3/10
[52] U.S. Cl. ............................ 156/628; 156/630; 156/668; 427/301; 427/304; 427/307
[58] Field of Search ................. 427/301, 304, 307; 156/628, 650, 651, 668, 630

[56] References Cited

U.S. PATENT DOCUMENTS

| | | | |
|---|---|---|---|
| 3,556,955 | 1/1971 | Ancker et al. | 204/30 |
| 3,563,784 | 2/1971 | Innes et al. | 117/47 |
| 3,579,365 | 5/1971 | Grunwald et al. | 106/265 |
| 3,751,287 | 8/1973 | Baier et al. | 427/47 A |
| 3,758,332 | 9/1973 | Dinella et al. | 117/47 |
| 3,769,061 | 10/1973 | Dutkewych et al. | 427/47 A |
| 3,955,024 | 5/1976 | Goldman et al. | 427/306 |
| 4,125,649 | 11/1978 | Donovan et al. | 427/307 |
| 4,325,992 | 4/1982 | Donovan, III et al. | 427/307 |
| 4,775,557 | 10/1988 | Bastenbeck et al. | 427/307 |

OTHER PUBLICATIONS

Standard Test Methods for Measuring Adhesion by Tape Test. ASTM: D3359-87.
The Condensed Chemical Dictionary, 10th Ed., p. 34.

*Primary Examiner*—Shrive Beck
*Assistant Examiner*—Brian K. Talbot
*Attorney, Agent, or Firm*—John L. Cordani

[57] ABSTRACT

A process is disclosed which is beneficially employed in sensitizing plastic surfaces prior to etching which sensitization enhances the coverage and adhesiveness of the subsequent plate. The composition and process proposed use Limonene, solutions of Limonene and Emulsions of Limonene for the sensitizer.

21 Claims, No Drawings

PROCESS FOR PREPARING PLASTIC SURFACES TO BE PLATED

FIELD OF THE INVENTION

This invention relates to a novel process used in preparing plastic surfaces so that the surface as treated can be effectively plated with an adherent coating.

BACKGROUND OF THE INVENTION

The plating of plastic parts is well known and of considerable commercial importance because the desirable characteristics of both the plastic and the metal are efficiently utilized in many applications. Thus a significant demand exists for metal plated plastic parts of all types. This includes not only plated plastic parts in general, but also the plated through-holes of printed circuit boards. In general, the process of plating plastics consists of etching the plastic surface followed by conditioning, activation and metallization.

The problems in plating plastics are well known in the art. One of the most serious problems is providing a plate which is sufficiently adherent to the plastic surface. Another equally troublesome problem is providing for complete and even coverage of the plastic surface. Various methods have been employed in the past to rectify these problems. One approach is to provide for a plastic surface pre-etch sensitizer which will sensitize the plastic surface and thereby allow the subsequent plastic etch to more effectively etch the plastic surface. It has been demonstrated that through this approach of etching a sensitized plastic surface more effectively both improved coverage and adhesion can be achieved. It is thought that improved coverage is achieved in this way because the rougher plastic surface adsorbs more plating catalyst and thereby plates more efficiently. It is also thought that the increased adhesion of the plate to the surface is due to the increased roughness of the etched plastic surface.

Various sensitizers are known in the art. U.S. Pat. No. 3,758,332 discloses the use of chemicals such as methyl ethyl ketone, tetrahydrofuran, dioxane, pyridine, dimethylformamide and various alcohol mixtures. U.S. Pat. No. 4,125,649 reveals the use of halogenated alcohols, ketones and aldehydes as sensitizers for polysulfone resins. U.S. Pat. No. 4,775,557 discloses the use of a compound of the general formula, $R_1(OC_nH_{2n})_mO-R_2$ as a sensitizer for polycarbonate resins, wherein $R_1$ and $R_2$ are selected from aryl or alkyl groups containing from 1-4 carbon atoms, n is 2 to 4 and m is 1 to 5. Finally U.S. Pat. Nos. 3,579,365 and 3,563,784 disclose an aqueous emulsion of turpentine with various surfactants as a sensitizing solution for acrylonitrile-butadiene-styrene (ABS). Various etchants for plastic which follow the sensitizer are known in the prior art including sulfuric acid, chromic acid, and permanganate solutions. These and other etch solutions are used following a sensitizer to etch and roughen the surfaces of various plastics in order to prepare these plastic surfaces for plating.

These sensitizers of the prior art have achieved mixed results. They have generally been moderately effective at increasing the coverage and adhesion of plated metal deposits on plastic substrates. Many of the prior art sensitizers were directed to ABS type plastics and are completely ineffective in sensitizing the polycarbonates and polycarbonate alloys which are extensively used today. But the most significant drawback of these prior art sensitizers is that they are relatively dangerous to handle and environmentally unsafe.

SUMMARY OF THE INVENTION

It has now been discovered that both the coverage and adhesion of plated metal deposits on plastic substrates, particularly polycarbonate and polycarbonate alloy substrates, can be enhanced by using a specific sensitizer solution prior to etching of the plastic surface. It has additionally been discovered that this particular sensitizer solution is both relatively safe to handle and environmentally friendly.

In the process of the invention the plastic or resin is first contacted for an effective time and at an effective temperature with a sensitizer composition comprising Limonene. Limonene has either one or both of the following structures:

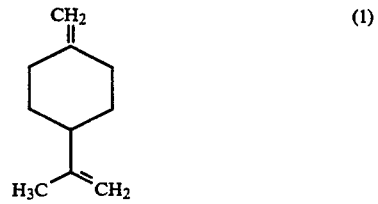
(1)

(d-Limonene)

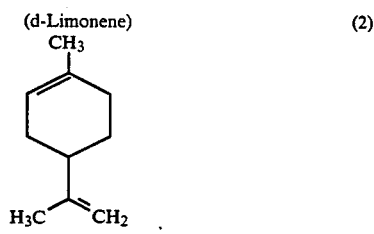
(2)

Another common name which describes these indicated structures is dipentene, thus references to Limonene shall be taken to include either or both of the indicated structures and shall be interpreted as being synonymous with dipentene and with p-mentha-diene which is another common name describing structure 2. p-menthadiene describes a group of compounds encompassing structure 2, but also includes structures the same as structure 2 but in which the ring double bond is shifted to any of the other 5 possible ring positions. Thus all p-mentha-dienes, Limonenes and dipentenes can successfully be used in the practice of this invention. However, it has been found that use of d-Limonene is most desireable.

d-Limonene is the most prevalent form of Limonene in nature and is the most useful form of Limonene for use in the process of this invention. d-Limonene occurs naturally in a wide variety of plants and is therefore readily available at low cost. It is derived from distilled orange rind oil and is therefore readily produced from citrus sources at low cost. It has been found that d-Limonene is also a very active plastic sensitizer and thus is the most preferred form of Limonene for use in this invention.

The sensitizer solution of this invention thus comprises Limonene, or more preferably an aqueous emulsion of Limonene comprising Limonene, water and an emulsifier which is effective in forming a stable emulsion of Limonene in water. The composition of the invention is employed at an effective temperate which, depending upon the actual composition, may vary from below room temperature to the boiling point of the composition. Preferably, the composition is employed at a temperature of from 120° to 140° F. The effective contact time will vary with the composition and temperature and preferably will be from 3 to 5 minutes.

Following sensitization of the plastic, the plastic will be rinsed and then treated with an appropriate etchant. This etchant can be any effective plastic etchant including alkali metal hydroxides, chromic acid, sulfuric acid and permanganate solutions. The concept of the invention is the sensitization of the plastic with Limonene prior to etching which sensitization enhances the etchability of the plastic and therefore increases coverage and adhesion of the plated deposit to follow. Thus it has been found that Limonene and solutions and emulsions of Limonene achieve this result with a variety of etchants and metallization processes which follow the sensitization.

After etching, a standard metallization cycle will include a neutralization step, an activation step and an acceleration step followed ultimately with metallization, there being appropriate rinse steps interposed between each step of the cycle. The time, temperature and compositions of each step following the sensitization may vary and are well known in the prior art.

DETAILED DESCRIPTION OF THE INVENTION

The process of the invention has been found to be particularly useful for sensitizing or conditioning plastics prior to plating and thus enhancing the adhesion and coverage of the plated deposit to and of the plastic surface. This process is useful in plating a variety of plastics including polysulfones, polypropylene, polyethylene, ABS and polyetherimides, but is particularly useful in plating polycarbonate and polycarbonate alloy resins.

Although the sensitizer or conditioner of this invention may comprise Limonene itself or solutions of Limonene with various solvents, the preferred embodiment of this invention consists of an aqueous emulsion of Limonene and most preferably a stable, clear aqueous emulsion of Limonene. This most preferred embodiment of this invention comprises water, Limonene and an emulsifier or emulsifiers which are effective to form a stable, clear emulsion of Limonene in water.

The emulsifying agents which may be used in this most preferred embodiment vary widely. One exemplary emulsifier is Mazclean EP which is a proproetary non-ionic surfactant sold by PPG Industries. Another suitable emulsifier is Citrosperse 120 which is a proprietary surfactant blend available from ICI Corporation. Finally a combination of Triton X-100, a proprietary surfactant sold by Rhom and Haas, and Dowfax 2A1 sold by Dow Chemicals, is also an effective emulsifier of Limonene in water.

The process to be used in employing the sensitizer of this invention will consist of the following steps;
1. Sensitization
2. Etch
3. Neutralization
4. Activation
5. Acceleration
6. Metallization along with appropriate rinse steps interspersed between each process step.

The sensitization step will comprise either Limonene itself, a solution of Limonene in an appropriate solvent or an emulsion of Limonene, preferably in water. This will be carried out by immersion or spray at a temperature ranging from room temperature to the boiling point of the composition, but preferably from between 120° and 140° F. The contact time will vary with the composition, temperature and the particular plastic being processed, but preferably will be from 3 to 5 minutes.

The etch step will consist of a variety of plastic etchants including without limitation alkali metal hydroxides, sulfuric acid, chromic acid, and permanganate solutions. Times and temperatures vary depending upon the composition and plastic under consideration.

Neutralization will effectively neutralize any etchant residues on the surface of the plastic. The particular neutralizer used depends upon the etchant used. For example, a suitable neutralizer for a permanganate etch is an acidic solution of hydrogen peroxide.

Activation consists of preparing the surface of the plastic so that it is catalytic to subsequent plating. The composition of this step can vary somewhat depending upon the particular type of plating which will follow. In the preferred embodiment, activation will be achieved with a precious metal catalyst, most preferably, a tin-palladium colloidal solution. The following acceleration step is optional with the purpose being enhancement of the activation of the surface.

The final step of metallization may in fact consist of several steps itself. In the preferred embodiment, the first step of metallization will consist of an electroless plating bath which is capable of depositing a metal layer on the activated surface of the plastic, the most preferred electroless plating bath being an electroless copper plating bath.

The use of Limonene to sensitize plastic surfaces before etching has a variety of advantages. The most important advantages of using Limonene as a pre-etch plastic sensitizer is that it increases both the adhesion of the subsequent plated deposit to the plastic surface and the coverage of the plate over the surface. These characteristics are obviously extremely important in the aesthetics and functioning of plated plastic parts. In addition, Limonene and solutions and emulsions thereof are relatively safe to handle and environmentally friendly. Limonene for the most part is derived from natural citrus sources and therefore provides these important safety and environmental advantages over the synthetic, inherently more dangerous and unsafe sensitizers of the prior art. The invention is further described in the following examples which are given to further illustrate the invention but shall be in no way limiting. The following standard process sequence was used to plate a variety of plastic parts:

a) Sensitize, 3–5 minutes, 120°–140° F.
b) Rinse, 3 minutes, room temperature
c) Etch, 7 minutes, 165° F. (MacDermid L-65 chromic acid etch was used)
d) Rinse, 3 min., room temperature
e) Neutralize, 2 min., 110° F. (MacDermid 9339 neutralizer was used)
f) Rinse, 3 min., room temperature
g) Activate, 3 min., 85° F. (MacDermid D-34C activator was used)
h) Rinse, 3 min., room temperature
i) Accelerate, 2 min., 120° F. (MacDermid MAC 25 Accelerator was used)
j) Rinse, 3 min., room temperature k) Electroless Copper, 15 min., 110° F. (MacDermid 7960 electroless copper was used)
l) Rinse, 3 min., room temperature
m) Activate, 2 min., 120° F. (MacDermid D-45 Activator was used)
n) Rinse, 3 min., room temperature
o) Electroless Nickel, 3 min., 140° F. (MacDermid 813 electroless nickel used)
p) Rinse, 3 min., room temperature
q) Dry This entire process was held constant through all examples for comparison purposes. The only step which varied was the sensitization step.

EXAMPLE I

The sensitizer used had the following composition:

| d-Limonene | 12.96% by wt. |
| Butyl Carbitol | 56.18% by wt. |
| Water | 30.86% by wt. |

The following plastic materials were run through this sensitizer solution and the standard cycle. The coverage and adhesion results were recorded. Coverage was gauged by the % area covered by plate. Adhesion was measured using the ASTM D-3359-87 standard cross hatch test for determining adhesion of a plate to a substrate and was graded on a scale of 0 to 5 with 5 being the most superior adhesion.

| | Coverage (%) | Adhesion |
|---|---|---|
| FR-90 Polycarbonate/ABS Alloy | 100 | 4 |
| GE-8002 Polycarbonate/ABS Alloy | 100 | 5 |
| FL-900 Polycarbonate | 100 | 3 |

EXAMPLE II

The sensitizer used had the following composition:

| d-Limonene | 19.2% by wt. |
| Ethylene Glycol | 23.7% by wt. |
| Mazclean EP[1] | 23.0% by wt. |
| Water | 34.1% by wt. |

The following plastic materials were run through this sensitizer and the standard cycle. The coverage and adhesion values were determined and recorded as in Example I.

| | Coverage (%) | Adhesion |
|---|---|---|
| FR-1441 Polycarbonate/ABS Alloy | 100 | 4 |
| GE-2800 Polycarbonate/ABS Alloy | 100 | 4 |
| T-85 Polycarbonate/ABS Alloy | 100 | 4 |

[1]Available from PPG Industries

EXAMPLE III

The sensitizer used had the following composition:

| d-Limonene | 21% by wt. |
| Mazclean EP | 23.4% by wt. |
| Butyl Carbitol | 5.6% by wt. |
| Water | 50% by wt. |

Plastic materials were processed through this sensitizer and the standard cycle. The coverage and adhesion values were determined and recorded as in Example I.

| | Coverage (%) | Adhesion |
|---|---|---|
| FL-900 Polycarbonate | 100 | 5 |
| GE-8002 Polycarbonate/ABS Alloy | 100 | 5 |
| Pulse 1370 Polycarbonate/ABS Alloy | 100 | 5 |
| FR-90 Polycarbonate/ABS Alloy | 100 | 5 |

EXAMPLE IV

The sensitizer used had the following composition:

| d-Limonene | 33.3% by wt. |
| Citrosperse 120[1] | 16.7% by wt. |
| Water | 50% by wt. |

Plastic materials were processed through this sensitizer and the standard cycle. The coverage and adhesion values were determined and recorded as in Example I.

| | Coverage (%) | Adhesion |
|---|---|---|
| GE-2800 Polycarbonate | 100 | 5 |
| GE-8007 Polycarbonate/ABS Alloy | 100 | 5 |
| FR-90 Polycarbonate/ABS Alloy | 100 | 5 |
| T-85 Polycarbonate/ABS Alloy | 100 | 5 |

[1]Available from ICI Corporation

EXAMPLE V

The following sensitizer composition was used:

| d-Limonene | 21% by wt. |
| Mazclean EP | 23.4% by wt. |
| Butyl Carbitol | 5.6% by wt. |
| Water | 50% by wt. |

Plastic materials were processed through this sensitizer and the standard cycle. The coverage and adhesion values were determined and recorded as in Example I.

| | Coverage (%) | Adhesion |
|---|---|---|
| Dow Styron 6087 Polystyrene | 100 | 4 |
| GE Prevex VJB Polyphenylene Ether | 100 | 4 |

Thus Limonene based sensitizers are effective in enhancing the adhesion and coverage of a variety of plastic substrates. In addition, these sensitizers are relatively safe to handle and safe for the environment.

What is claimed is:

1. A process for treating a plastic prior to etching to enhance the coverage and adhesiveness of subsequent plating on the etched plastic surface comprising:
   a) contacting the plastic with a sensitizer composition comprising p-mentha-diene;
   b) etching said sensitized plastic and
   c) metal plating said etched plastic.

2. A process according to claim 1 wherein the sensitizer composition comprises a solution of p-mentha-diene with a solvent for the p-mentha-diene.

3. A process according to claim 1 wherein the sensitizer composition comprises:
   a) a p-mentha-diene;
   b) a emulsifier effective to form an aqueous emulsion with said p-mentha-diene; and
   c) water.

4. A process according to claim 1 wherein the plastic is selected from a group consisting of polycarbonate, polycarbonate alloys, acrylonitrile-butadiene-styrene, polyetherimides, polysulfones, polypropylene and polyethylene.

5. A process according to claim 2 wherein the plastic is selected from a group consisting of polycarbonate, polycarbonate alloys, acrylonitrile-butadiene-styrene, polyetherimides, polysulfones, polypropylene, and polyethylene.

6. A process according to claim 3 wherein the plastic is selected from a group consisting of polycarbonate, polycarbonate alloys, acrylonitrile-butadiene-styrene, polyetherimides, polysulfones, polypropylene, and polyethylene.

7. A process according to claim 3 wherein the plastic is selected from a group consisting of polycarbonate, polycarbonate alloys.

8. A process for treating a plastic prior to etching to enhance the coverage and adhesiveness of subsequent plating on the etched plastic surface comprising:
   a) contacting the plastic with a sensitizer composition comprising Limonene;
   b) etching said sensitized plastic and
   c) metal plating said etched plastic.

9. A process according to claim 8 wherein the sensitizer composition comprises a solution of Limonene with a solvent for the Limonene.

10. A process according to claim 8 wherein the sensitizer composition comprises:
    a) a Limonene;
    b) a emulsifier effective to form an aqueous emulsion with said Limonene; and
    c) water.

11. A process according to claim 8 wherein the plastic is selected from a group consisting of polycarbonate, polycarbonate alloys, acrylonitrile-butadiene-styrene, polyetherimides, polysulfones, polypropylene and polyethylene.

12. A process according to claim 9 wherein the plastic is selected from a group consisting of polycarbonate, polycarbonate alloys, acrylonitrile-butadiene-styrene, polyetherimides, polysulfones, polypropylene, and polyethylene.

13. A process according to claim 10 wherein the plastic is selected from a group consisting of polycarbonate, polycarbonate alloys, acrylonitrile-butadiene-styrene, polyetherimides, polysulfones, polypropylene, and polyethylene.

14. A process according to claim 10 wherein the plastic is selected from a group consisting of polycarbonate, polycarbonate alloys.

15. A process for treating a plastic prior to etching to enhance the coverage and adhesiveness of subsequent plating on the etched plastic surface comprising:
    a) contacting the plastic with a sensitizer composition comprising d-Limonene;
    b) etching said sensitized plastic and
    c) metal plating said etched plastic.

16. A process according to claim 15 wherein the sensitizer composition comprises a solution of d-Limonene with a solvent for the d-Limonene.

17. A process according to claim 15 wherein the sensitizer composition comprises:
    a) a d-Limonene;
    b) an emulsifier effective to form an aqueous emulsion with said d-Limonene; and
    c) water.

18. A process according to claim 15 wherein the plastic is selected from a group consisting of polycarbonate, polycarbonate alloys, acrylonitrile-butadiene-styrene, polyetherimides, polysulfones, polypropylene and polyethylene.

19. A process according to claim 16 wherein the plastic is selected from a group consisting of polycarbonate, polycarbonate alloys, acrylonitrile-butadiene-styrene, polyetherimides, polysulfones, polypropylene, and polyethylene.

20. A process according to claim 17 wherein the plastic is selected from a group consisting of polycarbonate, polycarbonate alloys, acrylonitrile-butadiene-styrene, polyetherimides, polysulfones, polypropylene, and polyethylene.

21. A process according to claim 17 wherein the plastic is selected from a group consisting of polycarbonate, polycarbonate alloys.

* * * * *